US005574698A

United States Patent [19]

Raad

[11] Patent Number: 5,574,698
[45] Date of Patent: Nov. 12, 1996

[54] RAM ROW DECODE CIRCUITRY THAT UTILIZES A PRECHARGE CIRCUIT THAT IS DEACTIVATED BY A FEEDBACK FROM AN ACTIVATED WORD LINE DRIVER

[75] Inventor: George B. Raad, Boise, Id.

[73] Assignee: Micron Technology, Inc., Boise, Id.

[21] Appl. No.: 665,621

[22] Filed: Jun. 18, 1996

Related U.S. Application Data

[63] Continuation of Ser. No. 406,235, Mar. 17, 1995, abandoned, which is a continuation of Ser. No. 166,585, Dec. 13, 1993, Pat. No. 5,400,283.

[51] Int. Cl.$^6$ ..................................................... G11C 8/00
[52] U.S. Cl. ........................ 365/230.06; 365/203; 326/106
[58] Field of Search ............................. 365/230.06, 203, 365/230.01, 189.11, 230.03; 326/106, 105

[56] References Cited

U.S. PATENT DOCUMENTS

| | | | |
|---|---|---|---|
| 4,897,568 | 1/1990 | Chern et al. | 307/530 |
| 5,132,575 | 7/1992 | Chern | 307/530 |
| 5,206,551 | 4/1993 | Chern | 307/530 |
| 5,245,578 | 9/1993 | McLaury | 365/203 |
| 5,293,342 | 3/1994 | Casper et al. | 365/203 |
| 5,302,870 | 4/1994 | Chern | 307/530 |
| 5,311,481 | 5/1994 | Casper et al. | 365/230.06 |
| 5,400,283 | 3/1995 | Raad | 365/203 |

FOREIGN PATENT DOCUMENTS 0285793  11/1988  Japan ................. 365/230.06

Primary Examiner—David C. Nelms
Assistant Examiner—Huan Hoang
Attorney, Agent, or Firm—Susan B. Collier

[57] ABSTRACT

A precharge circuit which is deactivated once a word line driver is activated. Specifically, a low output signal created by the selected driver is fed back to the precharge circuit to deactivate the precharge circuit during activation of a chosen word line.

23 Claims, 3 Drawing Sheets

5,574,698

RAM ROW DECODE CIRCUITRY THAT UTILIZES A PRECHARGE CIRCUIT THAT IS DEACTIVATED BY A FEEDBACK FROM AN ACTIVATED WORD LINE DRIVER

This application is a continuation of application Ser. No. 08/406,235, filed Mar. 17, 1995, now abandoned, which is a continuation of George B. Raad's patent entitled "RAM ROW DECODE CIRCUITRY THAT UTILIZES A PRECHARGE CIRCUIT THAT IS DEACTIVATED BY A FEEDBACK FROM AN ACTIVATED WORDLINE DRIVER", application Ser. No. 08/166,585 filed on Dec. 13, 1993, which issued on Mar. 21, 1995 with U.S. Pat. No. 5,400,283.

FIELD OF THE INVENTION

The present invention relates to integrated circuits (ICs). Particularly, there is a circuit for decoding rows of a RAM. Uniquely, there is a high voltage precharge circuit that maintains a low or zero voltage level on the associated group of word lines.

BACKGROUND OF THE INVENTION

Row decodes are well-known in the art of memory devices. Typically these are a read and write memory device. Application programs that require storage space for variables and buffers can write data into RAM locations. The RAM data is addressed by direct reference rather than by a serial search of files or words. Previous decoding systems pass a high voltage through the decoding to select which row is to be accessed or turned on. Using a high voltage is slower than using a low voltage. Additionally, the high voltage decreases because of voltage threshold losses in the transistor. This voltage loss was not a problem when memory devices had supply potentials of 5 volts. However, current trends uses 3.3 and even lower voltages as supply potentials. These lower potentials can degrade the signal.

PROBLEMS

As a result of low supply voltages, there needs to be a precharge circuit to keep a low current and high voltage on the drivers during non-enablement of the drivers.

Therefore, a need exists to have a precharge circuitry that uses little real estate and can be deactivated once a word line driver is activated.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of a precharge circuitry that uses little real estate and can be deactivated once a word line driver is activated by being addressed.

Specifically, a low output signal of the selected driver is fed back to the precharge circuit, electrically interposed between the supply node coupled to Vccp and a common node, to deactivate the precharge circuit to deactivate it thereby alleviating the resulting effect between the low signal on the common node, which enables the drivers, and a precharge high voltage current of the precharge circuit.

Other features and advantages of the present invention may become clear from the following detailed description of the invention, taken in conjunction with the accompanying drawings and claims, or may be learned by the practice of the invention.

Figure 1:
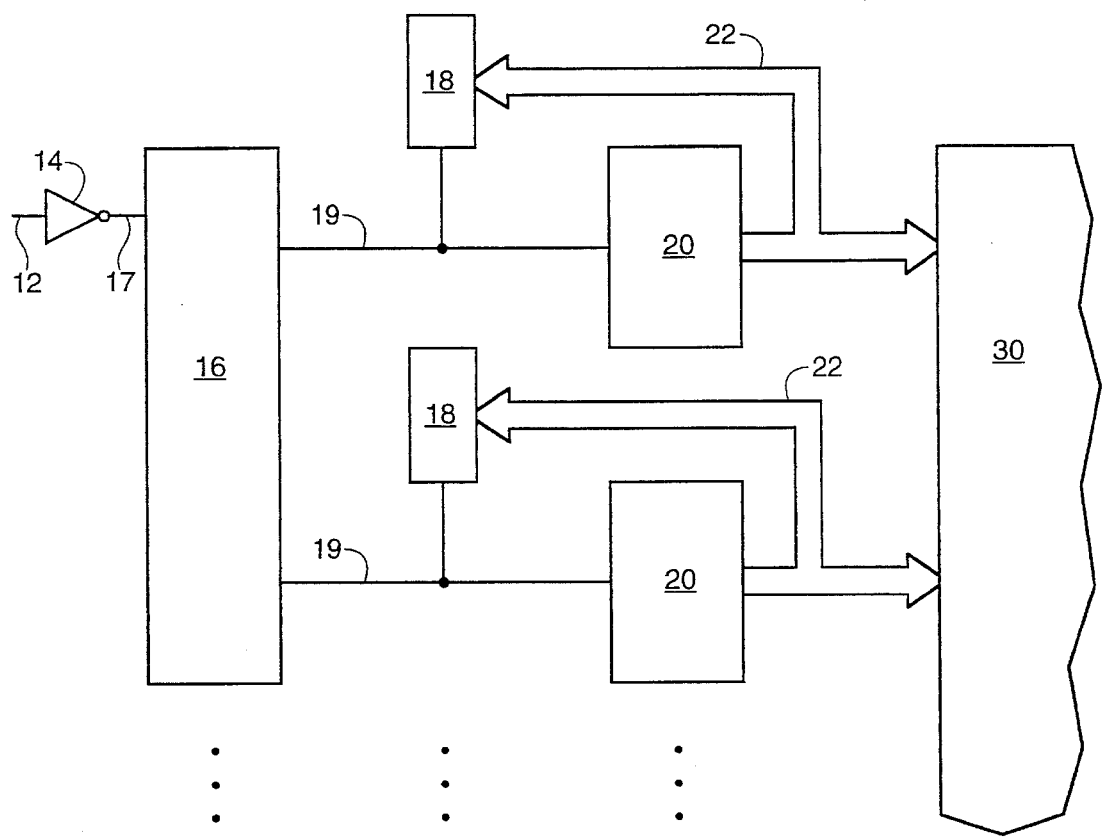
FIG. 1 is a block diagram of the interrelationship of the major parts of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

GENERAL EMBODIMENT

Uniquely, a whole packet of decode signals are sent to a memory device to select the specific row in the memory array. The whole memory device will receive 1) a first set of signals designating the section of the array containing the specific selected row; 2) a second set of signals is sent to the memory device that selects one of the many tree decodes to be activated in that section; 3) a third set of decode signals to the memory device will activate the specific word line driver circuit which in turn charges the row or word line to a digital one thus enabling the gates on that word line to be opened and thus dump out the signal of the particular memory cells chosen on that word line.

FIG. 1 is a block diagram of the interrelationship of the major parts of the invention, having the following elements: Input node 12 electrically coupled to a single section of the memory array 30. Inverter 14, outputs to node 17 which is coupled to at least one tree decode 16. Node 19 is coupled to the output of tree decode 16, precharge circuitry 18 and word line driver block 20. When a word line, roughly illustrated by multiple line element 22 is selected to be pulled high by the driver, there is a feedback to the precharge circuit 18. Feedback from the word lines will turn off the precharge circuitry.

Figure 2:
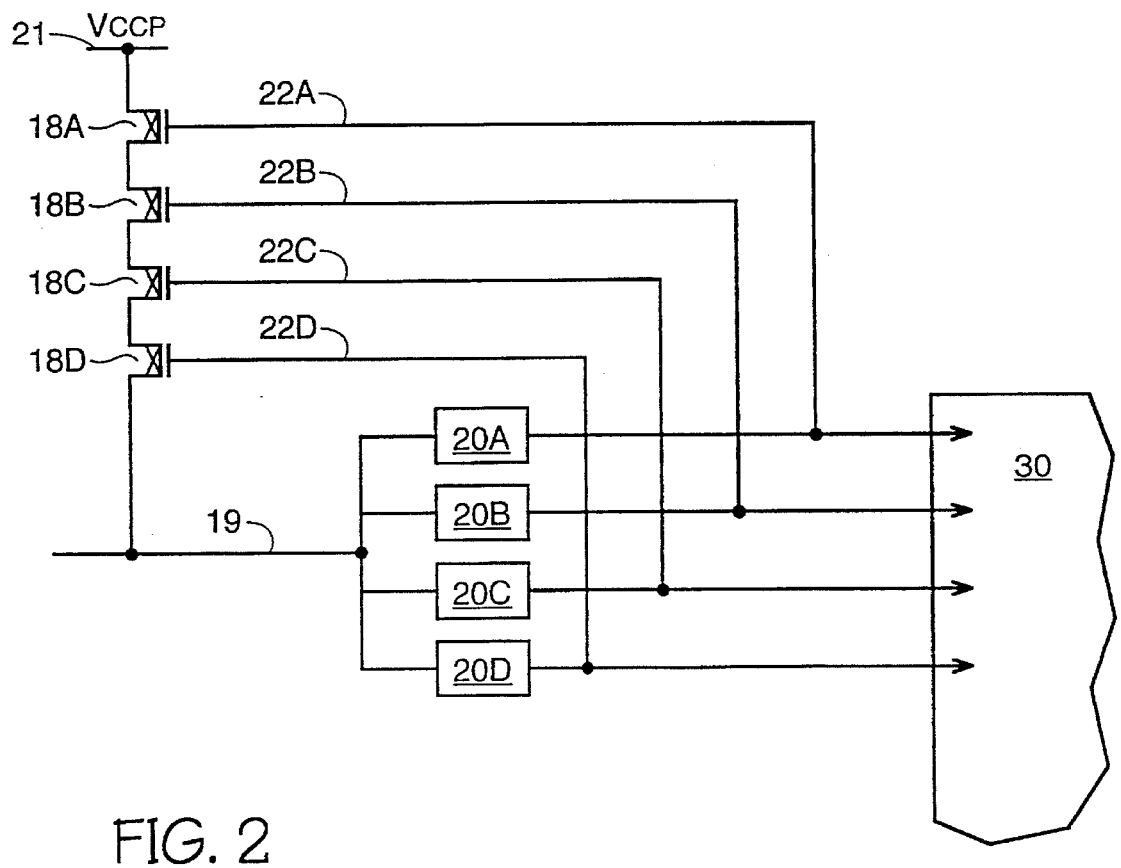
FIG. 2 is a detailed schematic of the pull up circuit and word line driver circuit interrelation.

FIG. 2 is a detailed schematic of the pull up circuit and word line driver circuit interrelation, having the following additional elements: P-channel transistors 18 A–D are in series with 1) a first end connected to node 21 having Vccp, or the power supply voltage, on it, and 2) a second end coupled to node 19. The gates of these transistors are connected to nodes 22 A–D respectively which are electrically coupled to the word line drivers 20 A–D respectively. Thus, when a particular word line is selected to be driven low, the feed back deactivates the appropriate precharge transistor, termination of precharge of node 19.

Figure 3:
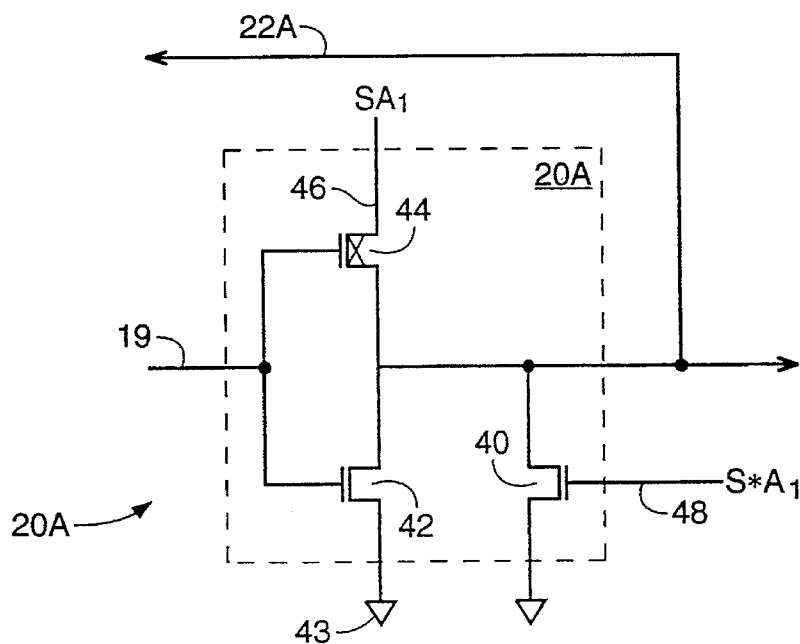
FIG. 3 is a detailed illustration of a single word line driver.

FIG. 3 is a detailed illustration of a single word line driver, having the following additional elements and signals: Transistors 44 and 42 forming an inverter with node 19, signal to word driver 20A, called SA and being coupled to a signal varying between ground and Vccp, and ground node 43. The output from the inverter goes to the word line node 22A. Transistor 40 is coupled between node 22A and ground its gate is coupled to node 48 which receives the inverse of the signal on node 46, S*A.

Figure 4:
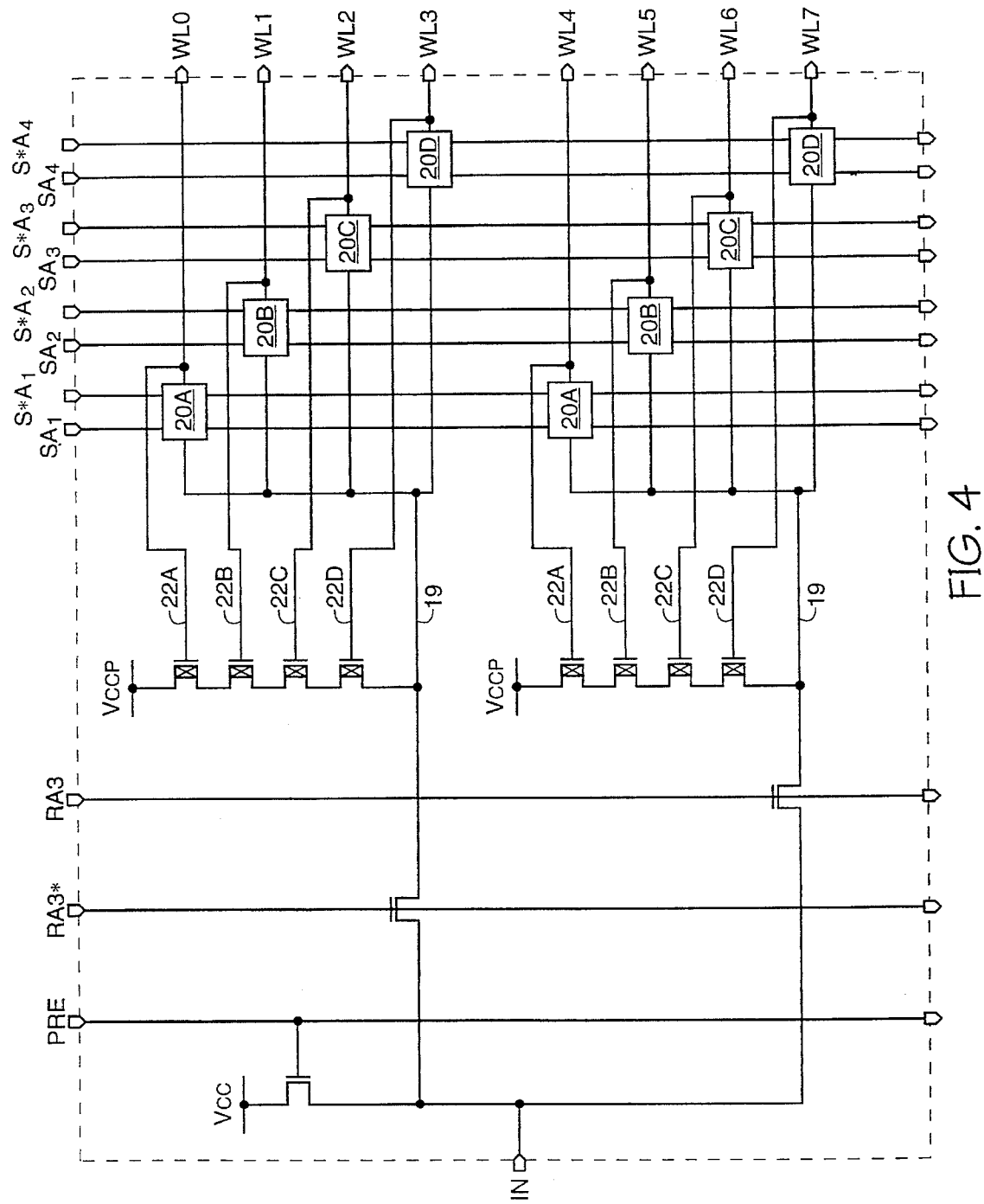
FIG. 4 is a single embodiment of the invention.

FIG. 4 is a single embodiment of the invention, having the additional wording as follows: WL (word line) zero to seven, corresponding to associated word line drivers. The two signals RA3* and RA3 in the tree decode determine which group of word line drivers are enabled. Signals SA1 and S*A1 to SA4 and S*A4 determine which of the enabled drivers is selected.

REMARKS ABOUT THE INVENTION

It is noted that, a skilled artisan will be very familiar with the operation of decoding circuitry for random access memories.

It is further noted that, this invention allows for a zero or low voltage signal on node 19 to enable the drives associated with node 19 and having the low signal.

Another feature of the invention is that the word line signal (high or low) is also fed back to the precharge circuit. If the word line is pulled high by the word line driver the precharge circuit is turned off via the high signal electrically coupled to the gate of a paired up P-channel transistor on the precharge circuit. The opposite occurs when the word line driver is pulled low by the driver, the associated transistor in the precharge circuit is left on. However, it only takes one of the four drivers to be activated to ultimately deactivate the precharge circuitry.

Another feature of the invention is that there are four word line drivers per tree decode, and one precharge circuit. Thus any time one of the word line drivers is selected the precharge circuit is deactivated.

It is noted that the four devices making up the precharge circuit are small devices, providing a small current of the high voltage to the drivers. Just enough to keep the driver outputs on a low voltage.

Similarly, it is noted, that the low voltage signal directed through the tree decode has a stronger current and therefore will over power the pull up circuit signal enough to activate the addressed word line driver.

Finally, the simplicity of the precharge circuitry and the associated control of the feed back signal should be noted. As a result there is little real estate used on the chip for this circuitry.

VARIATIONS IN THE INVENTION

There are several obvious variations to the broad invention and thus come within the scope of the present invention. Uniquely, this invention may work with any form known word line drivers. Additionally, although there are four matched sets of drivers to pull up circuit transistors, other numbers are feasible. Additionally, any number of tree decode transistors can be used in selecting which tree of the many to activate. Although, several nodes have been elevated to Vcc (power supply voltage level) the invention could have some of these nodes pumped above Vcc.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A memory system, comprising:
   a) memory device for storing data in an array of memory cells;
   b) a plurality of wordlines in electrical communication with the array;
   c) a plurality of driver circuits, each of said driver circuits having an input node and an output node, each of said driver circuits in electrical communication, at its output node, with one of said wordlines, the input nodes of said driver circuits connected at a common node, a potential on said common node enabling said plurality of driver circuits to drive a select potential to a selected wordline and enabling said plurality of driver circuits to drive a non-select potential to non-selected wordlines when said wordlines of said plurality of wordlines are non-selected;
   d) a plurality of serially connected transistors, each one of said serially connected transistors connected, at a control input, to the output node of a corresponding one of said driver circuits, said plurality of said serially connected transistors interposed between a supply node, connectable to a supply potential, and the common node;
   e) a decode circuit electrically interposed between a second supply node, connectable to a second supply potential, and said common node, said decode circuit allowing said potential of said common node to be pulled toward said first supply potential when all of said wordlines of said plurality of wordlines are non-selected, said decode circuit allowing said potential of said common node to attain a potential different than said first supply potential when at least one of said plurality of said wordlines is selected; and
   f) a means for sending decode signals to said driver circuits, said decode signals determining selected and non-selected said wordlines of said plurality.

2. A memory system, comprising:
   a) memory device for storing data in an array of memory cells;
   b) a plurality of wordlines in electrical communication with the array;
   c) a plurality of driver circuits, each of said driver circuits having an input node and an output node, each of said driver circuits in electrical communication, at its output node, with one of said wordlines, the input nodes of said driver circuits connected at a common node, a potential on said common node enabling said plurality of driver circuits to drive a select potential to a selected wordline and enabling said plurality of driver circuits to drive a non-select potential to non-selected wordlines when said wordlines of said plurality of wordlines are non-selected;

d) a plurality of serially connected transistors, each one of said serially connected transistors connected, at a control input, to the output node of a corresponding one of said driver circuits, said plurality of said serially connected transistors interposed between a supply node, connectable to a supply potential, and the common node; and e) a means for sending decode signals to said driver circuits, said decode signals determining selected and non-selected said wordlines of said plurality.

3. A method for selecting a select wordline in electrical communication with a memory cell to be accessed, comprising the following steps:

a) providing a plurality of driver circuits connected at a common node, each of said driver circuits having first and second select input nodes;

b) enabling said plurality of driver circuits at said common node;

c) coupling a supply potential to the first select input node of one of the driver circuits of said plurality;

d) driving a select potential to the select wordline in response to said step of coupling the supply potential to the first select input node;

e) coupling the supply potential to the second select input nodes in remaining said driver circuits of said plurality;

f) driving a non-select potential to non-selected wordlines in response to said step of coupling the supply potential to the second select input nodes of said remaining driver circuits;

g) deactuating a switching device with said select potential; and h) interrupting a current flow between a source of said supply potential and the common node of the plurality of driver circuits in response to said step of deactuating.

4. A method for selecting a select wordline in electrical communication with a memory cell to be accessed, comprising the following steps:

a) providing a plurality of driver circuits connected at a common node, each of said driver circuits having first and second select input nodes;

b) enabling said plurality of driver circuits at said common node;

c) coupling a supply potential to the first select input node of one of the driver circuits of said plurality;

d) driving a select potential to the select wordline in response to said step of coupling the supply potential to the first select input node;

e) precharging the common node to the supply potential;

f) driving a non-select potential to non-selected wordlines;

g) deactuating a switching device with said select potential; and h) interrupting a current flow between a source of said supply potential and the common node of the plurality of driver circuits in response to said step of deactuating.

5. A memory device for storing data in an array of memory cells, comprising:

a) a plurality of wordlines in electrical communication with the array;

b) a plurality of driver circuits, each of said driver circuits having an input node and an output node, each of said driver circuits in electrical communication, at its output node, with one of said wordlines, the input nodes of said driver circuits connected at a common node, a potential on said common node enabling said plurality of driver circuits to drive a select potential to a selected wordline and enabling said plurality of driver circuits to drive a non-select potential to non-selected wordlines when said wordlines of said plurality of wordlines are non-selected; and c) a plurality of serially connected transistors, each one of said serially connected transistors connected, at a control input, to the output node of a corresponding one of said driver circuits, said plurality of said serially connected transistors interposed between a first supply node, connectable to a first supply potential, and the common node.

6. The memory device as specified in claim 5, further comprising a decode circuit electrically interposed between a second supply node, connectable to a second supply potential, and said common node, wherein said second supply potential is pumped to create said first supply potential, said decode circuit allowing said potential of said common node to be pulled toward said first supply potential when all of said wordlines of said plurality of wordlines are non-selected, said decode circuit allowing said potential of said common node to attain a potential different than said first supply potential when at least one of said plurality of said wordlines is selected.

7. The memory device as specified in claim 5, wherein each of said driver circuits of said plurality of driver circuits comprises a first and a second decode input node, said first and said second decode input nodes of each of said driver circuits receiving complementary signals, wherein when said decode circuit is activated one of said wordlines of said plurality of wordlines is selected by said complimentary signals on its said first and said second decode input nodes, said complementary signals on said first and said second decode input nodes of remaining wordlines of said plurality of wordlines determining that said remaining wordlines of said plurality are non-selected.

8. The memory device as specified in claim 7, wherein at least one of said complementary signals in an address signal.

9. A memory device for storing data in an array of memory cells comprising:

a plurality of wordlines in electrical communication with the array;

a plurality of driver circuits, each of said driver circuits having an input node and an output node, each of said driver circuits in electrical communication, at its output node, with one of said wordlines, the input nodes of said plurality of driver circuits connected at a common node; and a plurality of serially connected transistors, each one of said serially connected transistors having a gate connected to the output node of a corresponding one of said driver circuits, said plurality of serially connected transistors interposed between a first supply node and the common node.

10. The memory device as specified in claim 9 wherein one of said serially connected transistors is deactuated by a potential of an active wordline.

11. The memory device as specified in claim 9 wherein said first supply node is connectable to a first supply potential, and wherein said memory device further comprises a decode circuit electrically interposed between a second supply node, connectable to a second supply potential, and said common node.

12. The memory device as specified in claim 11 wherein said decode circuit determines which of said wordlines are active and inactive.

13. The memory device as specified in claim 12 wherein one of said serially connected transistors is deactuated by a potential of an active wordline.

14. A memory device for storing data in an array of memory cells comprising:

a plurality of wordlines in electrical communication with the array;

a plurality of driver circuits, each of said driver circuits having an input node and an output node, each of said driver circuits in electrical communication, at its output node, with one of said wordlines, the input nodes of said plurality of driver circuits connected at a common node;

a plurality of serially connected transistors, each one of said serially connected transistors having a gate connected to the output node of a corresponding one of said driver circuits, said plurality of serially connected transistors interposed between a first supply node, connectable to a first supply potential, and the common node; and a decode circuit electrically interposed between a second supply node connectable to a second supply potential and said common node.

15. The memory system as specified in claim 14 wherein said decode circuit determines which of said wordlines are active and inactive.

16. The memory device as specified in claim 15 wherein one of said serially connected transistors is deactuated by a potential of an active wordline of said plurality of wordlines.

17. A memory system, comprising:

a memory device for storing data in an array of memory cells;

a plurality of wordlines in electrical communication with the array;

a plurality of driver circuits, each of said driver circuits having an input node and an output node, each of said driver circuits in electrical communication, at its output node, with one of said wordlines, the input nodes of said plurality of driver circuits connected at a common node;

a plurality of serially connected transistors, each one of said serially connected transistors having a gate connected to the output node of a corresponding one of said driver circuits, said plurality of said serially connected transistors interposed between a supply node and the common node; and a means for sending decode signals to said plurality of driver circuits, said decode signals determining selected and non-selected said wordlines of said plurality.

18. A memory device for storing data in an array of memory cells comprising:

a plurality of wordlines in electrical communication with the array;

a plurality of driver circuits, each of said driver circuits having an input node and an output node, each of said driver circuits in electrical communication, at its output node, with one of said wordlines, the input nodes of said plurality of driver circuits connected at a common node; and a precharge circuit interposed between a supply node and the common node, said precharge circuit connected to the output nodes of the plurality of driver circuits.

19. The memory device as specified in claim 18 wherein said precharge circuit is deactivated by a potential of an activated one of said plurality of wordlines.

20. The memory device as specified in claim 18 wherein said precharge circuit is connected to the output nodes of the plurality of driver circuits at a plurality of precharge circuit control nodes.

21. A memory device for storing data in an array of memory cells comprising:

a plurality of wordlines in electrical communication with the array;

a plurality of driver circuits, each of said driver circuits having an input node and an output node, each of said driver circuits in electrical communication with one of said wordlines, the input nodes of said plurality of driver circuits connected at a common node;

a precharge circuit interposed between a first supply node connectable to a first supply potential and the common node, said precharge circuit connected to the output nodes of the plurality of driver circuits; and a decode circuit electrically interposed between a second supply node, connectable to a second supply potential, and said common node, said decode circuit determining which of said wordlines are active and inactive.

22. The memory device as specified in claim 21, wherein said precharge circuit is deactivated by a potential on an activated one of said wordlines.

23. A memory system, comprising:

a memory device for storing data in an array of memory cells;

a plurality of wordlines in electrical communication with the array;

a plurality of driver circuits, each of said driver circuits having an input node and an output node, each of said driver circuits in electrical communication, at its output node, with one of said wordlines, the input nodes of said plurality of driver circuits connected at a common node; and a precharge circuit interposed between a supply node connectable to a supply potential and the common node, said precharge circuit connected to the output nodes of the plurality of driver circuits; and a means for sending decode signals to said plurality of driver circuits, said decode signals determining active and inactive wordlines of said plurality of wordlines, wherein said precharge circuit is deactivated by a potential on an activated one of said wordlines.

* * * * *